(12) United States Patent
Pamies-Juarez et al.

(10) Patent No.: US 10,146,618 B2
(45) Date of Patent: Dec. 4, 2018

(54) DISTRIBUTED DATA STORAGE WITH REDUCED STORAGE OVERHEAD USING REDUCED-DEPENDENCY ERASURE CODES

(71) Applicant: HGST Netherlands B.V., Amsterdam (NL)

(72) Inventors: Lluis Pamies-Juarez, San Jose, CA (US); Cyril Guyot, San Jose, CA (US); Robert Eugeniu Mateescu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 83 days.

(21) Appl. No.: 14/987,244

(22) Filed: Jan. 4, 2016

(65) Prior Publication Data

US 2017/0192848 A1 Jul. 6, 2017

(51) Int. Cl.
| | |
|---|---|
| *G06F 11/10* | (2006.01) |
| *H03M 13/15* | (2006.01) |
| *H03M 13/00* | (2006.01) |
| *H03M 13/27* | (2006.01) |
| *G06F 3/06* | (2006.01) |

(52) U.S. Cl.
CPC .......... *G06F 11/1076* (2013.01); *G06F 3/067* (2013.01); *G06F 3/0619* (2013.01); *G06F 3/0638* (2013.01); *H03M 13/154* (2013.01); *H03M 13/2792* (2013.01); *H03M 13/616* (2013.01)

(58) Field of Classification Search
CPC .. G06F 11/1076; G06F 3/0619; G06F 3/0638; G06F 3/067; H03M 13/154; H03M 13/2792; H03M 13/616

USPC .......... 714/755, 752, 799, 786, 801
See application file for complete search history.

(56) References Cited

U.S. PATENT DOCUMENTS

| | | | | |
|---|---|---|---|---|
| 8,706,701 | B1 * | 4/2014 | Stefanov | G06F 17/30197 707/687 |
| 10,001,922 | B2 * | 6/2018 | Blaum | G06F 3/0619 |
| 2003/0028509 | A1 * | 2/2003 | Sah | G06F 17/30595 |

(Continued)

OTHER PUBLICATIONS

Oggier et al., Coding Techniques for Repairability in Networked Distributed Storage Systems, Sep. 18, 2012, Nanyang Technological University Singapore, pp. 1-96.*

(Continued)

*Primary Examiner* — John J Tabone, Jr.
(74) *Attorney, Agent, or Firm* — Morgan, Lewis & Bockius LLP

(57) ABSTRACT

A system that implements a near-optimal, reduced-dependency erasure code construction to redundantly distribute computer data across multiple storage nodes includes a memory that stores machine instructions and a processor that executes the machine instructions to group storage segments into discrete groups, each of which corresponds to an individual storage node. The processor further executes the machine instructions to represent regeneration constraints and associate the constraints with storage segments in multiple storage nodes. The processor also executes the machine instructions to generate a parity check matrix based on the regeneration constraints, the associations and the storage segments. The processor additionally executes the machine instructions to construct a generator matrix based on the parity check matrix.

20 Claims, 7 Drawing Sheets

(56) References Cited

U.S. PATENT DOCUMENTS

| | | | | | |
|---|---|---|---|---|---|
| 2006/0107091 | A1* | 5/2006 | Hafner | | G06F 11/1076 714/5.1 |
| 2008/0016435 | A1* | 1/2008 | Goel | | G06F 11/1076 714/801 |
| 2008/0222480 | A1* | 9/2008 | Huang | | H03M 13/1191 714/752 |
| 2008/0222481 | A1* | 9/2008 | Huang | | H03M 13/1191 714/752 |
| 2011/0010599 | A1* | 1/2011 | Goel | | G06F 11/1076 714/752 |
| 2012/0079318 | A1* | 3/2012 | Colgrove | | G06F 3/0688 714/6.22 |
| 2012/0198195 | A1* | 8/2012 | Wylie | | G06F 11/1076 711/170 |
| 2013/0111293 | A1* | 5/2013 | Gladwin | | G06F 11/1076 714/752 |
| 2013/0311857 | A1* | 11/2013 | Murakami | | H03M 13/1154 714/786 |
| 2014/0164694 | A1* | 6/2014 | Storer | | G06F 11/1092 711/114 |
| 2015/0142863 | A1* | 5/2015 | Yuen | | H03M 13/13 707/827 |
| 2016/0335155 | A1* | 11/2016 | Jule | | G06F 11/1076 |
| 2017/0046227 | A1* | 2/2017 | Fan | | G06F 11/1088 |
| 2017/0063397 | A1* | 3/2017 | Richardson | | H03M 13/154 |
| 2017/0063399 | A1* | 3/2017 | Richardson | | H03M 13/154 |
| 2017/0179979 | A1* | 6/2017 | Hussain | | H03M 13/154 |

OTHER PUBLICATIONS

Kim at al., Regenerating Codes and Locally Recoverable Codes for Distributed Storage Systems, Carnegie Mellon University, Pittsburgh, PA, pp. 1-19.*

Han et al., Update-Efficient Error-Correcting Product-Matrix Codes, Jun. 25, 2014, IEEE, pp. 1-39.*

Tian et al., Layered, Exact-Repair Regenerating Codes Via Embedded Error Correction and Block Designs, Aug. 2, 2014, IEEE, pp. 1-26.*

* cited by examiner $$H_{inner} = \begin{pmatrix} 1..1..1............ \\ ........1..1..1..... \\ .......1..1........1.. \\ .1...........1......1. \\ ....1..........1.1.... \\ ..1......1........1.. \\ .....1.....1........1 \end{pmatrix}$$

FIG. 4

$$G_{inner} = \begin{pmatrix} 1......1............. \\ .1..................1. \\ ..1................1.. \\ ...1..1.............. \\ ....1..........1...... \\ .....1.............1 \\ ......1..........1... \\ .......1........1.... \\ ........1......1..... \\ .........1........1.. \\ ..........1.........1 \\ ...........1..1...... \\ ............1......1. \\ .............1.1..... \end{pmatrix}$$

FIG. 5

$$G_{outer} = \begin{pmatrix} 1 & . & * & . & . & . & . & . & . & * & . & . \\ . & 1 & . & . & * & . & * & . & . & . & . & . \\ . & . & 1 & . & * & . & . & . & . & * & . & . \\ . & . & * & 1 & * & . & . & . & . & . & . & . \\ . & * & . & . & 1 & . & * & . & . & . & . & . \\ . & * & . & . & . & 1 & . & . & . & * & . & . \\ . & . & * & . & . & . & 1 & . & * & . & . & . \\ . & . & . & . & . & . & . & 1 & . & . & . & . \\ . & . & . & . & * & . & . & . & 1 & * & . & . \\ . & . & . & * & . & . & . & . & . & 1 & . & . \\ . & * & . & . & . & . & * & . & . & . & 1 & . \\ . & * & . & . & . & * & . & . & . & . & . & 1 \end{pmatrix} \swarrow 80$$

FIG. 6

DISTRIBUTED DATA STORAGE WITH REDUCED STORAGE OVERHEAD USING REDUCED-DEPENDENCY ERASURE CODES

TECHNICAL FIELD

This description relates generally to data storage, and more particularly to redundant data storage using regenerating erasure codes.

BACKGROUND

Data storage involves the recording of digital computer data in a machine-readable medium. Storage generally refers to the retention of data over relatively longer periods of time than the typical retention of data in computer memory. Data storage media includes, for example, magnetic tape, hard disk drive (HDD), optical disk, flash memory and solid-state drive (SSD) devices.

Erasure coding (EC) typically refers to a method of securing stored data in which the data is broken into fragments, or chunks, which are expanded through an encoding process into codewords that include redundant data pieces, or symbols. The codewords generally are individually stored across multiple distributed storage media locations, or nodes. In general, when one or more nodes are erased or fail, the symbols stored in more than one of the remaining nodes can be used to reconstruct the data that was stored in the erased or failed node(s).

In general, erasure coding can provide greater fault tolerance than data replication methods with respect to the required amount of storage space, or storage overhead, in a distributed storage system. However, compared to replication, erasure codes typically require more network traffic and more input/output (I/O) accesses to the storage media in order to rebuild, or repair, lost data.

Regenerating codes include erasure codes that allow for rebuilding a failed node by accessing a subset of stored symbols on a subset of the remaining nodes such that the amount of network traffic required to repair the failed node is less that the complete data set. Ideally, regenerating codes provide a theoretically optimal tradeoff between the amount of data stored at each storage node, or storage overhead, and the network traffic, or repair bandwidth, required to regenerate the lost data.

The two extrema of this theoretically optimal tradeoff are known as Minimum Storage Regenerating (MSR) codes, which minimize the required storage node size at the expense of required repair bandwidth, and Minimum Bandwidth Regenerating (MBR) codes, which minimize the required repair bandwidth at the expense of required storage node size.

Exact Regenerating codes include Regenerating codes that allow for rebuilding of the exact content that was stored on a failed storage node. Further, exact regenerating codes, which precisely reconstruct storage data, cannot be achieved between the MSR and MBR points.

Several constructions of exact regenerating codes have been presented that attain the optimal tradeoff. MBR codes have been developed for any number of storage nodes having fault tolerances of any number less than the total number of storage nodes.

Nevertheless, some of the constructions of MSR code require that the data be fragmented into relatively small chunks before every encoding, decoding or repair operation. The required chunk size becomes exponentially smaller with respect to an increase in the number of nodes used to store the data. This factor can add complexity and cost to the storage process, making these MSR codes impractical for some storage scenarios.

SUMMARY

According to one embodiment of the present invention, a device for redundantly storing computer data includes a memory that stores machine instructions and a processor that executes the machine instructions to generate a first set of representations of a plurality of storage segments and a second set of representations of a plurality of regeneration constraints. The processor further executes the machine instructions to group the first set of representations into a plurality of discrete groups, and create a plurality of associations correlating each of the second set of representations with one of the first set of representations in each of a subset of the discrete groups. The processor also executes the machine instructions to generate a parity check matrix based on the first set of representations, the second set of representations, and the plurality of associations. The processor additionally executes the machine instructions to construct a generator matrix based on the parity check matrix. Each of the plurality of discrete groups corresponds to one of a plurality of storage nodes, and the plurality of associations are randomly distributed among the plurality of discrete groups.

According to another embodiment of the present invention, a method for redundantly storing computer data includes generating a first set of representations, each of which corresponds to a respective storage segment of a plurality of storage segments, and grouping the first set of representations into a plurality of discrete groups, each of which corresponds to a respective storage node of a plurality of storage nodes. The method further includes generating a second set of representations, each of which corresponds to a respective regeneration constraint of a plurality of regeneration constraints, and creating a plurality of associations that correlate each respective regeneration constraint with one respective storage segment corresponding to each of a subset of the discrete groups. The plurality of associations are substantially equally randomly distributed among the groups. The method also includes generating a parity check matrix based on the first set of representations, the second set of representations, and the plurality of associations, and constructing a generator matrix at least in part based on the parity check matrix.

According to yet another embodiment of the present invention, a computer program product for redundantly storing computer data includes a non-transitory, computer-readable storage medium encoded with instructions adapted to be executed by a processor to implement dividing an amount of storage data into a first number of data segments and apportioning a second number of redundant segments. A plurality of storage segments includes the first number of data segments and the second number of redundant segments. The instructions further implement generating a first set of representations corresponding to the plurality of storage segments and grouping the first set of representations into a plurality of discrete groups corresponding to a plurality of storage nodes. The instructions also implement generating a second set of representations corresponding to a plurality of regeneration constraints and creating a plurality of associations that correlate each of the plurality of regeneration constraints with one of the plurality of storage segments corresponding to each discrete group of a subset of the plurality of discrete groups. The plurality of associations are substantially equally randomly distributed among the plurality of discrete groups. The instructions additionally implement generating a parity check matrix based on the first set of representations, the second set of representations, and the plurality of associations. Moreover, the instructions implement constructing a generator matrix at least in part based on the parity check matrix.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4 is an illustration of an exemplary parity check matrix based on the Tanner graph of FIG. 3 in accordance with an embodiment of the present invention.

FIG. 5 is an illustration of an exemplary inner generator matrix based on the parity check matrix of FIG. 4 in accordance with an embodiment of the present invention.

FIG. 6 is an illustration of an exemplary outer generator matrix based on the inner generator matrix of FIG. 5 in accordance with an embodiment of the present invention.

DETAILED DESCRIPTION

An embodiment of the present invention provides a distributed storage system that allows exact regeneration of data in the case of erasure or node failure, while maintaining beneficial storage and repair overheads. The distributed storage system implements an erasure code construction that results in a ratio of storage overhead to repair overhead that does not precisely match the theoretical optimum. The disclosed method of erasure code construction achieves a tradeoff level between storage efficiency and repair bandwidth that is relatively close to an optimal value. Specifically, the disclosed erasure code construction achieves a storage/repair tradeoff relatively near the minimum storage regenerating (MSR) point.

In general, the disclosed method of erasure code construction supports the design of a distributed storage system with any desired parameters, such as number of storage nodes or failure tolerance. Implementing a distributed storage system using the disclosed erasure code construction method involves significantly less computational complexity than that required to implement some existing solutions. As a result, the disclosed construction can be beneficially applied in many practical applications to implement codes with a near-optimal ratio between storage overhead and repair bandwidth near the MSR point, which can be of particular interest in large data center scenarios.

Figure 1:
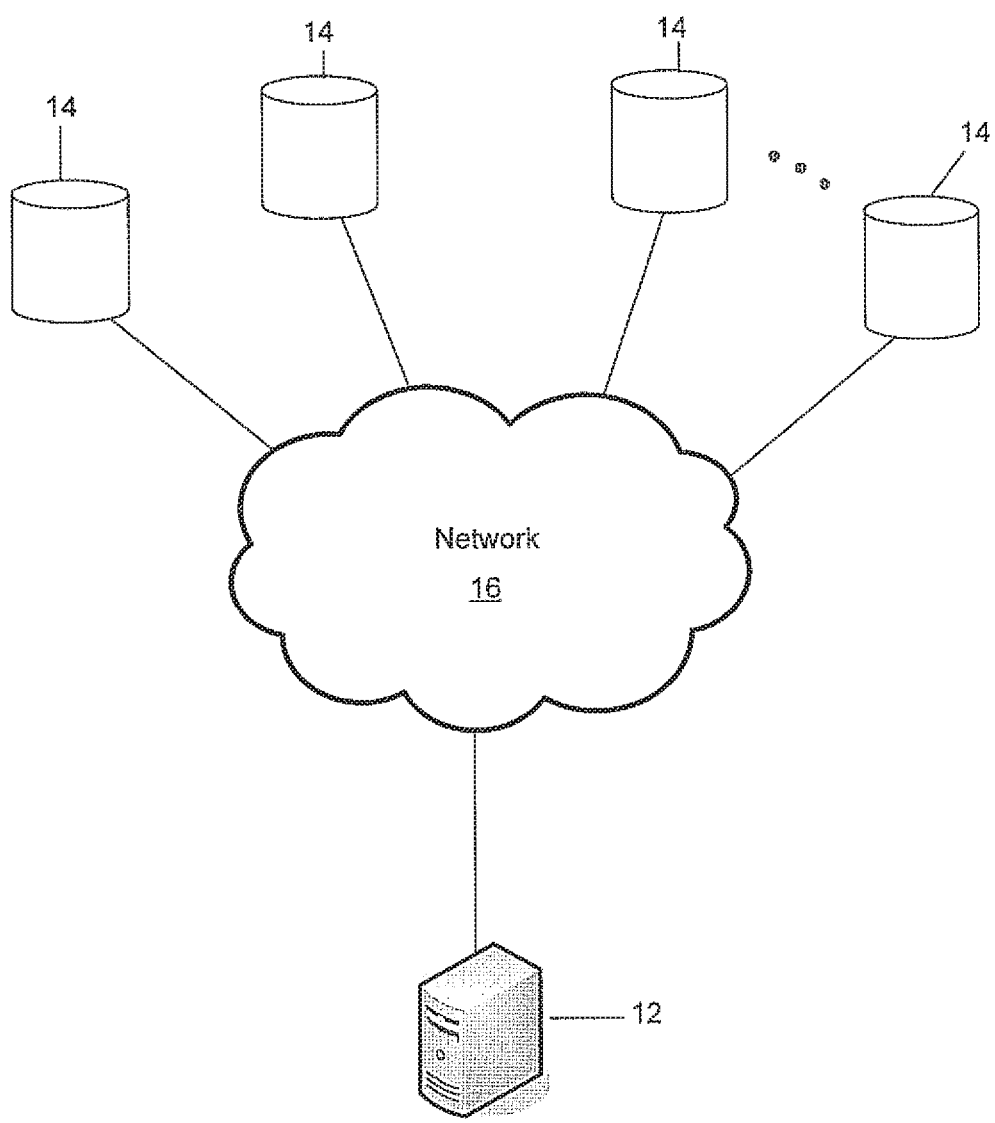
FIG. 1 is a schematic view illustrating an exemplary distributed storage system in accordance with an embodiment of the present invention.

An embodiment of the present invention is shown in FIG. 1, which illustrates an exemplary distributed storage system 10 that implements a near-optimal, reduced-dependency erasure code construction in order to redundantly distribute data across multiple storage nodes. The distributed storage system 10 includes a codeword generator 12 and multiple storage nodes 14. The codeword generator 12 is communicatively connected to the storage nodes 14 by way of a communication network 16.

The distributed storage system 10 provides redundant data protection that can reconstruct complete storage data from fewer than the total number of storage nodes 14. In order to accomplish this, the codeword generator 12 divides input storage data into a series of fragments, or data segments. The data segments are expanded and transformed, by way of a near-optimal, reduced-dependency erasure code construction method, into a number of codeword symbols including redundant data. The number of storage nodes is determined by the length of the code. The codeword symbols, or storage segments, are stored approximately evenly across the storage nodes 14. For example, an equal number of storage segments may be stored at each of the storage nodes 14. The codeword generator 12 sends each group of codeword symbols to a separate storage node.

Should the data stored in one or more of the storage nodes 14 be lost, for example, due to erasure or node failure, the complete storage data can be regenerated from any sufficient subset of the storage nodes 14. The resulting fault tolerance, that is, the number of storage nodes 14 that may be regenerated after simultaneous erasure or loss, is determined by the distance of the code. In various embodiments, a symbol may include any combination of discrete data, for example, any number of binary data, or bits.

The redundancy rate of the erasure code can be designed to tolerate a predetermined number of node erasures or failures among the storage nodes 14. That is to say, the erasure code can be designed to enable accurate recovery of the complete storage data from the remaining nodes after any combination of the storage nodes 14 up to the predetermined number have been erased or have failed.

In various embodiments, each of the storage nodes 14 may include, for example, a tape drive, a hard disk drive (HDD), a solid-state drive (SSD), or any other suitable type of digital storage device. The storage nodes 14 may be physically separated, for example, in different geographical locations, collocated or included in a single appliance. In an alternative embodiment, the storage nodes 14 may include individual chips, or dies, in a solid-state drive.

The communication network 16 can include any viable combination of devices and systems capable of linking computer-based systems, such as the Internet; an intranet or extranet; a local area network (LAN); a wide area network (WAN); a direct cable connection; a storage bus; a private network; a public network; an Ethernet-based system; a token ring; a value-added network; a telephony-based system, including, for example, T1 or E1 devices; an Asynchronous Transfer Mode (ATM) network; a wired system; a wireless system; an optical system; a combination of any number of distributed processing networks or systems or the like.

In general, an array code can be defined as an injective mapping, $C: \mathbb{F}_q^K \rightarrow \mathbb{F}_q^{(\alpha \times n)}$, where a vector of K input symbols is encoded into an $\alpha \times n$ matrix, for $n\alpha \geq K \geq 1$ and $\alpha \geq 1$. Distributed storage systems can use array codes to store vectors containing K symbols worth of user data into α×n codeword matrices, where each codeword column is stored into a different storage node. In this context the code introduces redundancy in the storage system that allows decoding or retrieval of the stored user data even when one or more storage nodes fail, or when one or more codeword columns are erased.

A K×nα generator matrix, G, can be constructed for the array code by vectorizing the array representation column-by-column. In doing so, the first α columns of G generally represent the first codeword column, the second α columns of G generally represent the second codeword column, and so on. These n groups of α columns in G may be referred to as "thick" columns.

The ψ-node rank accumulation of the code represented by G can be defined as:

$$l(\psi) = \min\{\text{rank}(G|_{S_\psi}) | S_\psi \subseteq [n]\}$$

where $S_\psi \subseteq [n]$ is an arbitrary subset of thick columns of G, and $G|_{S_\psi}$ is the restriction of G to $S_\psi$.

The value of $l(\psi)$ represents the maximum amount of user data that can be decoded when reading the content of any ψ out of n nodes. This value is of importance because it is equivalent to the amount of data that could be recovered after the failure of any n−ψ nodes. In general, $l\psi \leq K$, so long as $\psi \in [n]$, where [n] represents the set $\{1, 2, 3, \ldots, n-1, n\}$. Further, when K is a multiple of α, that is, when K=kα, and lk=K, then the code is a maximum-distance-separable (MDS) array code with minimum distance n−k+1.

Near-optimal, reduced-dependency erasure codes include a family of array codes with the regenerating property. In an embodiment, the construction of an (n, k, α, d) near-optimal, reduced-dependency erasure code may be accomplished by means of a product code generator matrix, $G = G_{outer} \cdot G_{inner}$. That is to say, the near-optimal, reduced-dependency erasure code is the product of two matrices, for example, an inner code, $G_{inner}$, and an outer code, $G_{outer}$.

Figure 2:
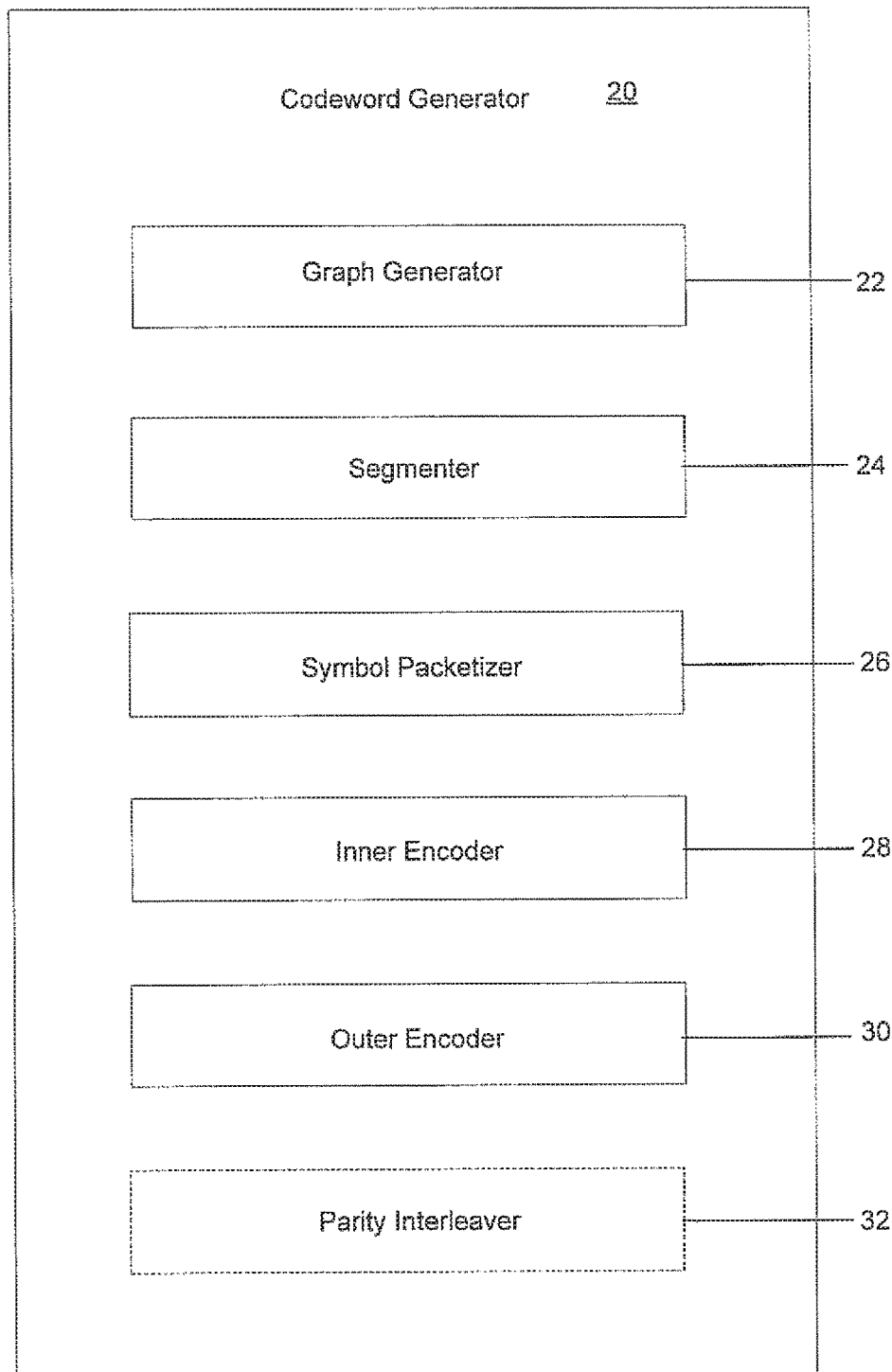
FIG. 2 is a block diagram depicting an exemplary codeword generator that can be employed in the distributed storage system of FIG. 1.

Referring to FIG. 2, an exemplary codeword generator 20 includes a graph generator 22, a segmenter 24, a symbol packetizer 26, an inner encoder 28, an outer encoder 30 and, optionally, a parity interleaver 32. The codeword generator 20 receives a sequence of input data and produces a sequence of grouped codeword symbols, or storage segments, using a global generator matrix, $G = G_{outer} \cdot G_{inner}$. The global generator matrix, G, is the product-matrix of an outer generator matrix, $G_{outer}$, and an inner generator matrix, $G_{inner}$.

In an embodiment, the inner code is constructed in accordance with a biregular graph, such as a Tanner graph. A biregular graph is a bipartite graph, G=(U, V, E), for which every two vertexes on the same side of the given bipartition have the same degree. For example, α and d denote the left and right degrees, respectively, such that α=deg(u), $\forall u \in U$, and $\forall v \in V$. Further, |U|=n, and due to the graph regularity, α·|U|=d·|V|=|E|. The following pseudocode represents an exemplary method that can be used in an embodiment to generate a random auxiliary graph, G:

```
E ← ∅
c ← nα/d
for all v ∈ [c] do
    for all i ∈ [d] do
        M ← arg min |{ u,v ∈ E | u = u',v ∈ [c]}|
        u ← pick_random_element(M)
        E ← E ∪ { u,v }
    end for
end for
G ← ([n],[c],E)
```

Using any arbitrary graph, G, having the properties $\mathcal{U}_i = \{i\alpha + j | j \in [\alpha]\}$ and $\mathcal{U} = \cup_{i \in [n]} \mathcal{U}_i$, where $\mathcal{V} = \{u, v | u \in \mathcal{U}_i, v \in \mathcal{V}, i \in [n], i, v \in E\}$, a Tanner graph, $\mathcal{G} = (\mathcal{U}, \mathcal{V}, \mathcal{V})$, may be constructed.

Figure 3:
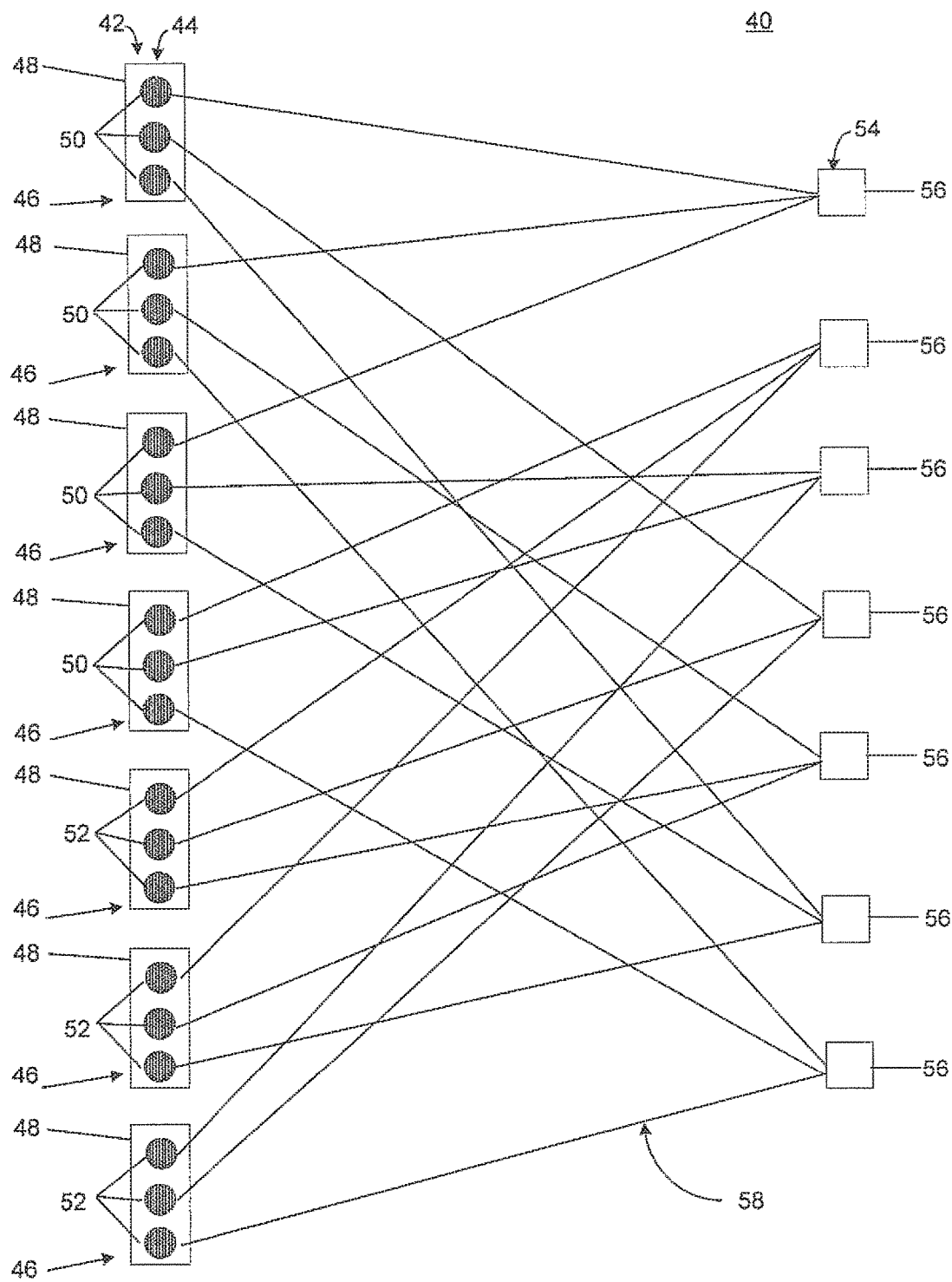
FIG. 3 is a schematic view depicting an exemplary Tanner graph representing associations between storage segments, storage nodes and regenerations constraints in accordance with an embodiment of the present invention.

The graph generator 22 graphically represents the repair properties of a near-optimal, reduced-dependency erasure code. Referring to FIG. 3, an exemplary graph 40 is shown, which represents a near-optimal, reduced-dependency (7,4) erasure code. The graph 40, also known as a Tanner graph, illustrates the relationship between the storage nodes, the storage segments and repair data. The graph 40 includes a bipartite graph with two disjoint sets of vertices. The first set of vertices 42 on one side of the graph 40 are representations of the storage segments 44, or code symbols, divided into groups 46 stored in individual storage nodes 48.

The storage segments 44 include data segments 50 (input symbols) and redundant segments 52, or symbols. The second set of vertices 54 along the opposite side of the graph 40 are representations of regeneration constraints 56. Edges 58 representing associations between the regeneration constraints 56 and the storage segments 44 connect each constraint 56 with the storage segments 44 that store data associated with the constraint 56 in a subset of the groups 46.

The segmenter 24 divides the input storage data into a series of fragments, or data segments 44. The number of data segments 44 may be predetermined, for example, in accordance with the number of data segments 44 to be stored at each storage node 48, the amount of input storage data, the number of storage nodes 48 and the capacity of the individual nodes 48.

The symbol packetizer 26 groups the outer code matrix components into discrete groups 46 corresponding to the storage segments that will be stored together at each storage node 48 in accordance with the graph 40. The number of storage segments in each group 46 is the selected multiple. The number of storage nodes 48 required to store the storage segments 44 is approximately equal to the number of storage segments divided by the number of symbols in each group 46.

For example, in the graph 40 of FIG. 3, the first three storage segments are to be stored at the first storage node; the fourth, fifth and sixth storage segments are to be stored at the second storage node; the seventh, eighth and ninth storage segments are to be stored at the third storage node; the tenth, eleventh and twelfth storage segments are to be stored at the fourth storage node; the thirteenth, fourteenth and fifteenth storage segments are to be stored at the fifth storage node; the sixteenth, seventeenth and eighteenth storage segments are to be stored at the sixth storage node; and the nineteenth, twentieth and twenty-first storage segments are to be stored at the seventh storage node.

In an embodiment, the graph generator 22 randomly distributes the edges 58 for all the constraints 56 among the storage node groupings. For example, in an embodiment, the graph generator 22 assigns the same number of edges 58 to data segments 44 of each storage node 48 (in the case that the number of edges 58 is equal to a multiple of the number of storage nodes 48). In another embodiment, the number of edges 58 assigned to data segments 44 of each storage node 48 does not vary by more than one.

In addition, in an embodiment, the graph generator 22 assigns each of the edges 58 associated with each respective constraint 56 to different groups 46 of symbols, or storage nodes 48. Further, in an embodiment, the graph generator 22 connects each edge 58 to a unique storage segment, such that each stored symbol is associated with at most one edge 58.

In addition, in an embodiment, the graph generator 22 connects relatively few edges 58 to each constraint 56, resulting in a relatively low degree graph.

If a storage node 48 storing one of the symbols associated with a particular constraint 56 is erased or fails, the remaining symbols associated with the constraint 56 can be read to regenerate the missing symbol. In an embodiment, the number of constraints 56 is equal to the number of storage nodes 48. In other embodiments, the number of constraints may be less than or greater than the number of storage nodes 48.

Although the graph 40 of FIG. 3 represents seven storage nodes 48, each storing a grouping of three storage segments 44, various embodiments may include any useful number of storage nodes with any number of symbols per node. For example, various embodiments may include five storage nodes, ten storage nodes, twenty storage nodes, or fifty storage nodes, each node storing ten segments, twenty segments, fifty segments or a hundred segments.

The inner encoder 28 creates a parity check matrix, $H_{inner}$, based on the number of regeneration constraints 56, the edges 58 or associations, and the total number of storage segments 44. Referring to FIG. 4, an exemplary parity check matrix 60 is shown based on the graph 40 of FIG. 3. Periods in the parity check matrix 60 represent components with the value zero. Each of the constraints 56 in the graph 40 corresponds to a row of the parity check matrix 60, and each of the storage segments 44 corresponds to a column of the parity check matrix 60. Edges 58 connecting each of the constraints 56 to a storage segment 44 in a storage node 48 correlate to non-zero components of the parity check matrix 60. Thus, the graph 40 illustrates the repair properties of the code, indicating the dependencies required for regeneration of any erased or lost data symbol.

The inner encoder 28 deterministically constructs the inner generator matrix from the resulting parity check matrix 60. Referring to FIG. 5, an exemplary inner generator matrix 70 is shown based on the parity check matrix 60 of FIG. 4. Periods in the inner generator 70 matrix represent components with the value zero.

The inner encoder 28 applies the inner generator matrix, $G_{inner}$, to the outer codeword matrix resulting from application of the outer generator matrix, $G_{outer}$, to create the storage segments. For example, the inner encoder 28 multiplies the outer code vector with the inner generator matrix, $G_{inner}$, to create a sequence of codeword symbols, or storage segments. The combination of implementation of the inner generator matrix, $G_{inner}$, by the inner encoder 28 and of the outer generator matrix, $G_{outer}$, by the outer encoder 30 effectively implement the global generator matrix, $G = G_{outer} \cdot G_{inner}$. The sequence of codeword symbols includes the data included in the input symbols along with redundant data to allow recovery or regeneration of the data. Thus, the sequence of codeword symbols is larger than the sequence of input symbols.

The near-optimal, reduced-dependency inner code, $C_{inner}$, is the binary code represented by the Tanner graph, $\mathcal{G}$. The inner code can be represented by an $$\binom{n\alpha}{d} \times n\alpha$$

binary parity check matrix $H_{inner}$ (that is, over $\mathbb{F}_2$), where $h_{ij}=1$ if, and only if, $j, i \in \mathcal{V}$.

The inner code, $C_{inner}$, represents an $\alpha \times n$ array code, where the symbols on the ith column represent the variables coming from $\mathcal{U}_i$. Hence, the inner code, $C_{inner}$ may also be represented by an $$n\alpha \binom{d-1}{d} \times n\alpha$$

generator matrix, $G_{inner}$, with thick columns of width $\alpha$.

As an array code, the near-optimal, reduced-dependency inner code provides a mechanism to encode a vector with $$n\alpha \binom{d-1}{d}$$

data symbols into an $\alpha \times n$ codeword matrix, where any k out of n nodes allow decoding at most $K = 1_{inner} k$ data symbols. Thus, in order to obtain an array code that is capable of deterministically decoding a full vector of user data, an outer code, $C_{outer}$, must be used.

For example, in an embodiment, by the maximum-distance-separable (MDS) property, a $$\left[ K, n\alpha \binom{d-1}{d} \right]_q$$

MDS code, such as a Reed-Solomon code, over an alphabet of size $q=2^p$, and with a generator matrix, $G_{outer}$, can recover the original message encoded by $C_{outer}$ from any K of the $$n\alpha \binom{d-1}{d}$$

codeword symbols. As a result, a code with generator matrix, $G = G_{outer} \cdot G_{inner}$, can be used to recover the original data by reading any k of the n storage nodes.

However, when an MDS outer code is used, the resulting global generator matrix is a dense matrix, which requires relatively complex encoding computations. Thus, in another embodiment, in an effort to reduce the complexity of the encoding computations, a non-MDS outer code is used, with the requirement that $1_{inner} k=K$. Since $K < k\alpha$, non-MDS codes that comply with this requirement can guarantee that any k nodes are able to decode the original data vector. In general, random sparse generator matrices $G_{outer}$ over $\mathbb{F}_{2^8}$ (that is, a finite field, or Galois field, of order 256) can guarantee at any k nodes are able to decode the original data vector for relatively small values of k, n, and $\alpha$.

The outer encoder 30 constructs the outer generator matrix, $G_{outer}$, based on the inner generator matrix, $G_{inner}$, and the size of the input data vector, K. The outer generator matrix row size matches the column size of the inner generator matrix, $G_{inner}$. The outer generator matrix column size equals the capacity of the inner generator matrix, that is, the minimum rank of all combinations of sets of columns equaling the storage segment group size (thick columns) from the inner generator matrix. For example, in an embodiment, the outer generator matrix is composed of an identity matrix with size equaling the minimum rank of all combinations of thick columns combined with additional columns of redundant parities.

The optional parity interleaver 32 can randomly interleave random numbers in each row of the outer generator matrix to match the number of input data segments with the length of the inner generator matrix. Referring to FIG. 6, an exemplary outer generator matrix 80 is shown based on the graph 40 of FIG. 3. For example, in the case that the row size of the inner generator matrix is four components longer than the minimum rank of all combinations of thick columns from the inner generator matrix, four columns with parity values are interleaved at random locations in the outer generator matrix, $G_{outer}$. Periods in the outer generator matrix 80 represent components with the value zero, and stars, or asterisks, represent non-zero parity values.

The interleaving reduces the number of non-zero parities required to guarantee exact recovery of the input data symbols. For example, in an embodiment, approximately 12% of the interleaved parities are assigned non-zero values to guarantee recovery of all the input data symbols. In various embodiments, for example, fewer than approximately 12½%, fewer than approximately 15%, or fewer than approximately 20% of the interleaved column components are assigned non-zero values.

In an alternative embodiment, a random sparse matrix is appended to the end of the systematic matrix instead of randomly interleaving columns with the added values throughout the outer generator matrix, $G_{outer}$. However, this scheme requires a relatively higher number of non-zero values, for example, more than approximately 25% non-zero values, in order to guarantee recovery of all the input data symbols. This can result in relatively high computational complexity in some data storage scenarios.

In another alternative embodiment, a Reed-Solomon code, a low-density parity-check (LDPC) code, or another relatively more complex coding algorithm is used to expand the outer generator matrix. In general, these schemes entail relatively complex computations, which may not be practical in some data storage scenarios.

The outer encoder 30 applies the outer generator matrix, $G_{outer}$, to the input data segments to create an outer code matrix. For example, the outer encoder 30 performs finite field operations to multiply the input data symbols with the outer generator matrix.

Near-optimal, reduced-dependency erasure codes possess an inherent regenerating property that enables regeneration of failed nodes utilizing relatively low network traffic and relatively few input/output operations, compared to existing methods. Given the Tanner graph, $\mathcal{U} = (\mathcal{G}, \mathcal{V}, \mathcal{V})$, described above, the uth erased symbol, $u \in \mathcal{U}$, can be regenerated by performing an exclusive 'OR' operation (XOR) on the symbols indexed by R={u'|u'≠u, u', v, u, v∈$\mathcal{V}$}, where |R|=d−1. Since deg(u)=1, $\forall u \in \mathcal{U}$, the total number of symbols read to regenerate the α symbols in a node is equal to α(d−1). Furthermore, due to the random construction of $\mathcal{G}$, for large values of α the number of nodes read from each node will on average equal $$\frac{\alpha(d-1)}{n-1}.$$

Figure 7:
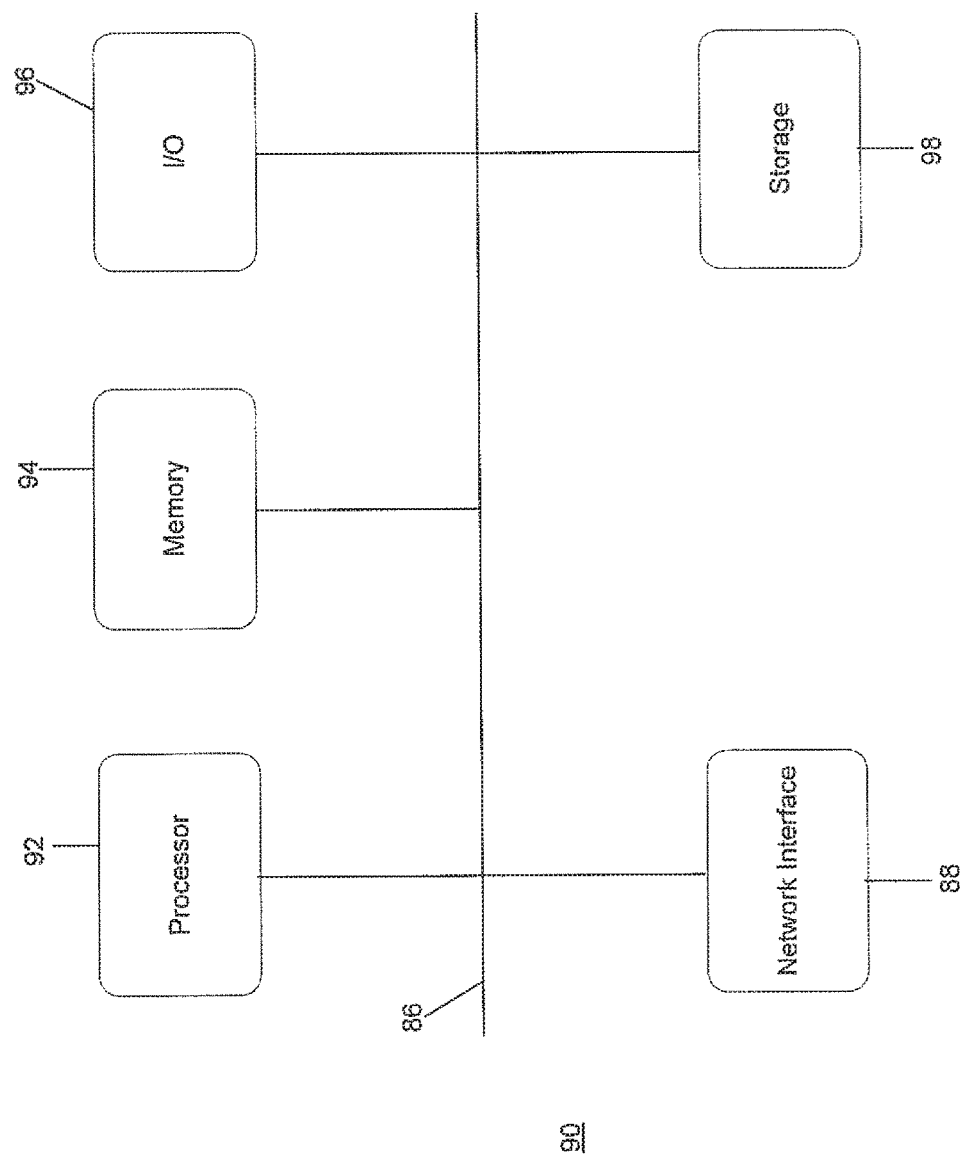
FIG. 7 is a schematic view depicting an exemplary general computing system that can be employed in the distributed storage system of FIG. 1.

As illustrated in FIG. 7, an exemplary general computing device 90 that can be employed in the distributed storage system 10 of FIG. 1 includes a processor 92, a memory 94, an input/output device (I/O) 96, storage 98 and a network interface 88. The various components of the computing device 90 are coupled by a local data link 86, which in various embodiments incorporates, for example, an address bus, a data bus, a serial bus, a parallel bus, or any combination of these.

The computing device 90 communicates information to and requests input from the user or other devices by way of the I/O 96, which in various embodiments incorporates, for example, an interactive, menu-driven, visual display-based user interface, or graphical user interface (GUI), a pointing device, such as a, with which the user may interactively input information using direct manipulation of the GUI. In some embodiments, direct manipulation includes the use of an alphanumeric input device, such as a keyboard, a pointing device, such as a mouse, a touchpad, a trackball, a joystick or a stylus, to select from a variety of windows, icons and selectable fields, including selectable menus, drop-down menus, tabs, buttons, bullets, checkboxes, text boxes, and the like. Nevertheless, various embodiments of the invention may incorporate any number of additional functional user interface schemes in place of this interface scheme, with or without the use of an alphanumeric input device, a pointing device, buttons or keys, for example, using direct voice input.

The computing device 90 is coupled to the communication network 16 by way of the network interface 88, which in various embodiments incorporates, for example, any combination of devices—as well as any associated software or firmware—configured to couple processor-based systems, including modems, access points, network interface cards, LAN or WAN interfaces, wireless or optical interfaces and the like, along with any associated transmission protocols, as may be desired or required by the design.

The computing device 90 can be used, for example, to implement the functions of the components of the distributed storage system 10 of FIG. 1. In various embodiments, the computing device 90 can include, for example, a server, a controller, a workstation, a mainframe computer, personal computer (PC), a note pad, a computing tablet, a personal digital assistant (PDA), a smart phone, a wearable device, or the like. Programming code, such as source code, object code or executable code, stored on a computer-readable medium, such as the storage 98 or a peripheral storage component coupled to the computing device 90, can be loaded into the memory 94 and executed by the processor 92 in order to perform the functions of the distributed storage system 10.

Figure 8:
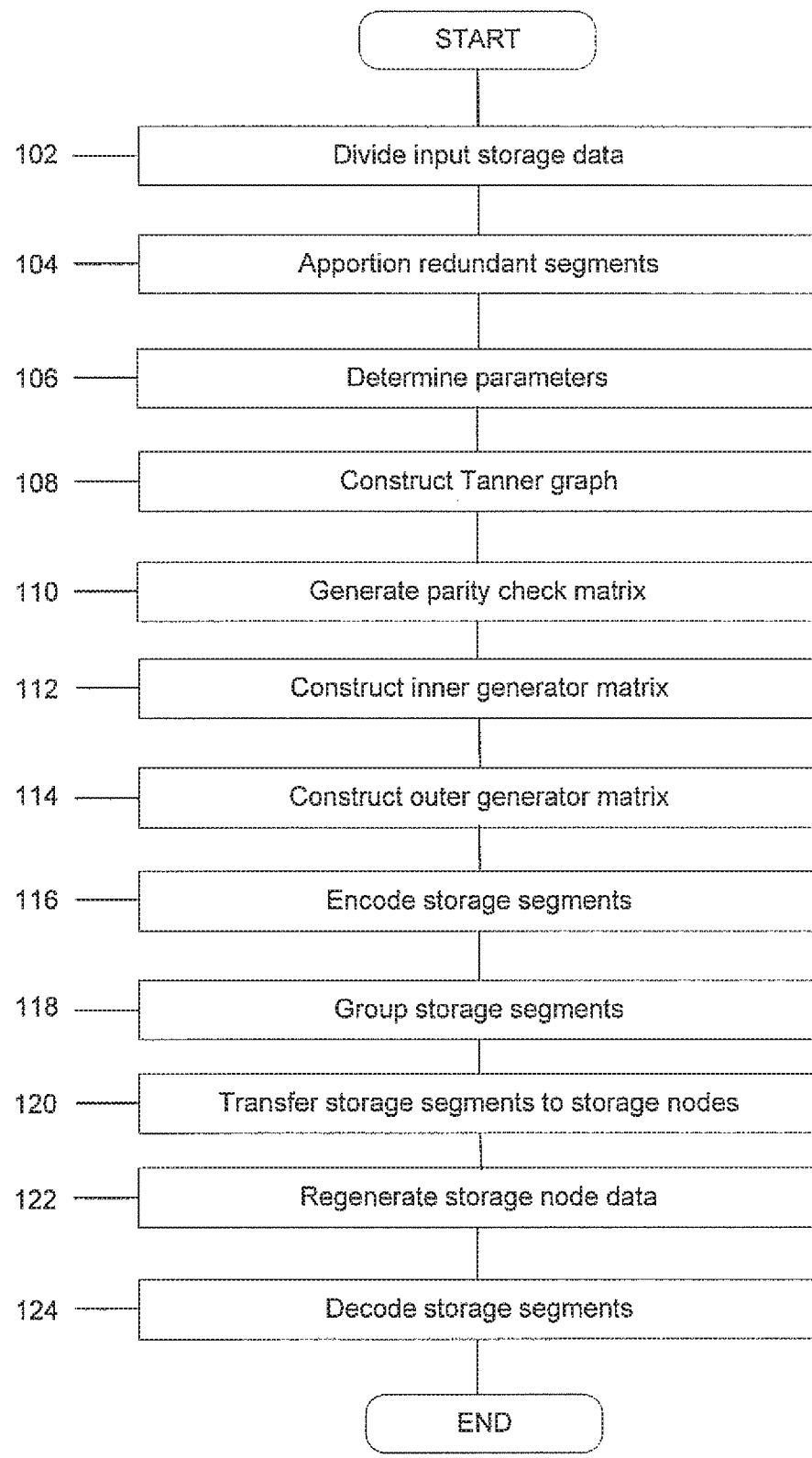
FIG. 8 is a flowchart representing an exemplary method of redundantly distributing data across multiple storage nodes in accordance with an embodiment of the present invention.

Referring now to FIG. 8, an exemplary process flow is illustrated that may be performed, for example, by the distributed storage system 10 of FIG. 1 to implement an embodiment of the method described in this disclosure for constructing near-optimal, reduced-dependency erasure codes to redundantly distribute data across multiple storage nodes. The process begins at block 102, where input storage data is divided into multiple data segments as explained above. In block 104, redundant segments are allotted, or apportioned, for storing redundant data based on the input storage data.

Values are determined for, or assigned to, various code parameters in block 106, for example, the quantity of storage nodes that will be employed, the total number of storage segments including the data segments and the redundant segments, and the number of regeneration constraints. In block 108, a bipartite graph is constructed to represent the regeneration constraints associated with the storage segments and the storage nodes, as explained above.

A parity check matrix is generated, in block 110, based on the bipartite graph, and in block 112 an inner generator matrix is constructed to transform symbols of an outer code matrix into output codeword symbols, or storage segments. In block 114, an outer generator matrix is constructed to transform the symbols of the input storage data into an outer code matrix. As explained above, the inner and outer generator matrices combined form a generator matrix to transform the symbols of the input storage data into the symbols of the storage segments.

The storage segments, including the data segments and the redundant segments, are encoded in block 116 by applying the outer generator matrix to the input storage data to create an outer code matrix, and applying the inner generator matrix to the outer code matrix to create the codeword symbols, or storage segments. In block 118, the storage segments are grouped, or packetized, into groups corresponding to the individual storage nodes to be employed to store the storage segments.

In block 120, the groups of storage segments are transferred to the storage nodes. After a storage node, or multiple storage nodes up to a failure tolerance number of storage nodes, fail or are erased, in block 122 the lost storage node data is regenerated from the remaining storage segments associated with the lost storage segments by the regeneration constraints. In block 124, the storage segments, or any subset of storage segments, are decoded to retrieve the stored data from the storage nodes.

Aspects of this disclosure are described herein with reference to flowchart illustrations or block diagrams, in which each block or any combination of blocks can be implemented by computer program instructions. The instructions may be provided to a processor of a general purpose computer, special purpose computer, or other programmable data processing apparatus to effectuate a machine or article of manufacture, and when executed by the processor the instructions create means for implementing the functions, acts or events specified in each block or combination of blocks in the diagrams.

In this regard, each block in the flowchart or block diagrams may correspond to a module, segment, or portion of code that including one or more executable instructions for implementing the specified logical function(s). It should also be noted that, in some alternative implementations, the functionality associated with any block may occur out of the order noted in the figures. For example, two blocks shown in succession may, in fact, be executed substantially concurrently, or blocks may sometimes be executed in reverse order. Optional components or blocks are shown with dashed lines in the figures.

A person of ordinary skill in the art will appreciate that aspects of this disclosure may be embodied as a device, system, method or computer program product. Accordingly, aspects of this disclosure, generally referred to herein as circuits, modules, components or systems, or the like, may be embodied in hardware, in software (including firmware, resident software, microcode, etc.), or in any combination of software and hardware, including computer program products embodied in a computer-readable medium having computer-readable program code embodied thereon.

It will be understood that various modifications may be made. For example, useful results still could be achieved if steps of the disclosed techniques were performed in a different order, and/or if components in the disclosed systems were combined in a different manner and/or replaced or supplemented by other components. Accordingly, other implementations are within the scope of the following claims.

What is claimed is:

1. A device for redundantly storing computer data, comprising:
   a non-transitory memory that stores machine instructions; and
   a processor coupled to the non-transitory memory that executes the machine instructions to:
   generate a first set of representations of a plurality of storage segments;
   generate a second set of representations of a plurality of regeneration constraints, wherein each of the regeneration constraints is configured such that when data is lost each of the regeneration constraints regenerates a portion of the plurality of storage segments so that the lost data is recovered, and each of the regeneration constraints regenerates and recovers a lost portion of the plurality of storage segments;
   group the first set of representations into a plurality of discrete groups;
   create a plurality of associations correlating each of the second set of representations with one of the first set of representations in each discrete group of a subset of the plurality of discrete groups;
   generate a parity check matrix based on the first set of representations, the second set of representations, and the plurality of associations; and
   construct a generator matrix based on the parity check matrix, each of the plurality of discrete groups corresponding to a respective storage node of a plurality of storage nodes, and the plurality of associations randomly distributed among the plurality of discrete groups.

2. The device of claim 1, wherein the processor further executes the machine instructions to:
   determine a first number and a second number;
   divide an amount of storage data into a plurality of data segments equal to the first number; and
   apportion a plurality of redundant segments equal to the second number, the plurality of storage segments including the plurality of data segments and the plurality of redundant segments, and a ratio of the first number to a sum of the first and second numbers corresponding to an encoding rate.

3. The device of claim 2, wherein the processor further executes the machine instructions to:
   construct a bipartite graph and generate the parity check matrix based on the graph,
   wherein the first set of representations includes a first plurality of vertices representing the plurality of data segments and the plurality of redundant segments, the second set of representations includes a second plurality of vertices representing the plurality of regeneration constraints, and the plurality of associations includes a plurality of edges connecting each of the first plurality of vertices with a respective vertex of the second plurality of vertices, the plurality of edges approximately equally distributed among the first vertices, the first plurality of vertices and the second plurality of vertices forming two disjoint sets of vertices, and the first plurality of vertices grouped into approximately equally-sized subsets corresponding to each of the plurality of discrete groups.

4. The device of claim 1, wherein each of the plurality of associations corresponding to a respective regeneration constraint of the plurality of regeneration constraints associates the respective regeneration constraint to a respective storage node of the plurality of storage nodes.

5. The device of claim 1, wherein each of the plurality of associations corresponds to a respective data segment of the plurality of data segments or to a respective redundant segment of the plurality of redundant segments.

6. The device of claim 1, wherein each of the plurality of regeneration constraints corresponds to ten or fewer of the plurality of associations.

7. The device of claim 1, wherein executing the machine instructions to construct the generator matrix further comprises constructing an inner generator matrix based on the parity check matrix, and constructing an outer generator matrix based on the inner generator matrix and the first number of data segments, wherein the generator matrix is the matrix product of the inner generator matrix and outer generator matrix.

8. A method for redundantly storing computer data, comprising:
  generating a first set of representations, each of the first set of representations corresponding to a respective storage segment of a plurality of storage segments;
  grouping the first set of representations into a plurality of discrete groups, each of the plurality of discrete groups corresponding to a respective storage node of a plurality of storage nodes;
  generating a second set of representations, each of the second set of representations corresponding to a respective regeneration constraint of a plurality of regeneration constraints, wherein each of the regeneration constraints is configured such that when data is lost each of the regeneration constraints regenerates a portion of the plurality of storage segments so that the lost data is recovered, and each of the regeneration constraints regenerates and recovers a lost portion of the plurality of storage segments;
  creating a plurality of associations that correlate each respective regeneration constraint with one respective storage segment corresponding to each discrete group of a subset of the plurality of discrete groups, the plurality of associations substantially equally randomly distributed among the plurality of discrete groups;
  generating a parity check matrix based on the first set of representations, the second set of representations, and the plurality of associations; and
  constructing a generator matrix at least in part based on the parity check matrix.

9. The method of claim 8, further comprising:
  dividing an amount of storage data into a first number of data segments; and
  apportioning a second number of redundant segments, the plurality of storage segments including the first number of data segments and the second number of redundant segments.

10. The method of claim 9, further comprising:
  determining the first number; and
  determining the second number, wherein a ratio of the first number to a sum of the first number and the second number corresponds to an encoding rate.

11. The method of claim 9, wherein constructing the generator matrix further comprises:
  constructing an inner generator matrix based on the parity check matrix; and
  constructing an outer generator matrix based on the inner generator matrix and the first number of data segments, wherein the generator matrix is the matrix product of the inner generator matrix and outer generator matrix.

12. The method of claim 11, wherein constructing the outer generator matrix further comprises designing the outer generator matrix with a first dimension equal to an opposite dimension of the inner generator matrix, and a second dimension equal to a minimum rank corresponding to a submatrix based on a combination of column sets associated with the inner generator matrix, each column set including a third number of columns equal to a fourth number of storage segments in each of the plurality of discrete groups.

13. The method of claim 12, wherein constructing the outer generator matrix further comprises interleaving a matrix column including a redundant parity value with an identity matrix having a third dimension equal to the number of first data segments.

14. The method of claim 9, further comprising determining a third number of discrete groups of the plurality of discrete groups in the subset, wherein the third number corresponds to a degree associated with each respective regeneration constraint.

15. The method of claim 8, further comprising:
  constructing a bipartite graph wherein the first set of representations includes a first plurality of vertices representing the first number of data segments and the second number of redundant segments, the second set of representations includes a second plurality of vertices representing the plurality of regeneration constraints, and the plurality of associations includes a plurality of edges connecting each of the first plurality of vertices with a respective vertex of the second plurality of vertices, the plurality of edges approximately equally distributed among the first vertices, the first plurality of vertices and the second plurality of vertices forming two disjoint sets of vertices, and the first plurality of vertices grouped into approximately equally-sized subsets corresponding to each discrete group of the plurality of discrete groups; and
  generating the parity check matrix based on the bipartite graph.

16. The method of claim 8, wherein each of the plurality of associations corresponds to a respective data segment of the first number of data segments or to a respective redundant segment of the second number of redundant segments.

17. The method of claim 8, wherein each of the plurality of associations corresponding to each respective regeneration constraint of the plurality of regeneration constraints correlates the respective regeneration constraint to a respective storage node of the plurality of storage nodes.

18. The method of claim 8, wherein the plurality of storage nodes includes at least five and not greater than twenty-five storage nodes, and the plurality of storage segments includes at least fifty and not greater than two thousand five hundred storage segments.

19. A computer program product for redundantly storing computer data, comprising:
  a non-transitory, computer-readable storage medium encoded with instructions, which when executed by a processor, cause the processor to perform:
  dividing an amount of storage data into a first number of data segments;
  apportioning a second number of redundant segments, a plurality of storage segments including the first number of data segments and the second number of redundant segments;
  generating a first set of representations corresponding to the plurality of storage segments;
  grouping the first set of representations into a plurality of discrete groups corresponding to a plurality of storage nodes;

generating a second set of representations corresponding to a plurality of regeneration constraints, wherein each of the regeneration constraints is configured such that when data is lost each of the regeneration constraints regenerates a portion of the plurality of storage segments so that the lost data is recovered, and each of the regeneration constraints regenerates and recovers a lost portion of the plurality of storage segments;

creating a plurality of associations that correlate each of the plurality of regeneration constraints with one of the plurality of storage segments corresponding to each discrete group of a subset of the plurality of discrete groups, the plurality of associations substantially equally randomly distributed among the plurality of discrete groups;

generating a parity check matrix based on the first set of representations, the second set of representations, and the plurality of associations; and constructing a generator matrix at least in part based on the parity check matrix.

20. The computer program product of claim 19, further comprising instructions, which when executed by the processor, cause the processor to perform:

constructing a bipartite graph wherein the first set of representations includes a first plurality of vertices representing the first number of data segments and the second number of redundant segments, the second set of representations includes a second plurality of vertices representing the plurality of regeneration constraints, and the plurality of associations includes a plurality of edges connecting each of the first plurality of vertices with one of the second plurality of vertices, the plurality of edges approximately equally distributed among the first plurality of vertices, the first plurality of vertices and the second plurality of vertices forming two disjoint sets of vertices, and the first plurality of vertices grouped into approximately equally-sized subsets corresponding to each of the plurality of discrete groups; and generating the parity check matrix based on the bipartite graph.

* * * * *